United States Patent
Naijo

(10) Patent No.: US 8,405,120 B2
(45) Date of Patent: Mar. 26, 2013

(54) ORGANIC LIGHT EMITTING DIODE DEVICE

(75) Inventor: Tsuyoshi Naijo, Yongin (KR)

(73) Assignee: Samsung Display Co., Ltd. (KR)

( * ) Notice: Subject to any disclaimer, the term of this patent is extended or adjusted under 35 U.S.C. 154(b) by 154 days.

(21) Appl. No.: 13/021,673

(22) Filed: Feb. 4, 2011

(65) Prior Publication Data

US 2011/0193130 A1    Aug. 11, 2011

(30) Foreign Application Priority Data

Feb. 5, 2010  (KR) .................. 10-2010-0011008

(51) Int. Cl.
*H01L 33/52*  (2010.01)
(52) U.S. Cl. .......................................... 257/100
(58) Field of Classification Search ............ 257/79–103, 257/13, 40, 918, E33.001–E33.077, E25.028, 257/E25.032, 116, 117, 432–437, 749, 457, 257/642–643, 759, E51.001–E51.052, E25.008–E25.009; 438/29, 69, 82, 28, 22, 47, 493, 503, 507, 438/956, 51, 55, 64–68, 83, 98
See application file for complete search history.

(56) References Cited

U.S. PATENT DOCUMENTS

| | | | |
|---|---|---|---|
| 2009/0072255 A1* | 3/2009 | Takahashi et al. | 257/98 |
| 2010/0051924 A1* | 3/2010 | Hwang et al. | 257/40 |
| 2010/0133522 A1* | 6/2010 | Pieh et al. | 257/40 |
| 2010/0155739 A1* | 6/2010 | Kuramoto et al. | 257/76 |

FOREIGN PATENT DOCUMENTS

| | | |
|---|---|---|
| JP | 2008-077943 | 4/2008 |
| JP | 2009-037801 | 2/2009 |
| KR | 1020030068654 | 8/2003 |
| KR | 10-2006-0060171 | 6/2006 |
| KR | 1020060080437 | 7/2006 |
| KR | 10-2008-0111423 | 12/2008 |
| KR | 1020090051508 | 5/2009 |
| KR | 1020090056783 A | 6/2009 |

* cited by examiner

*Primary Examiner* — Dao H Nguyen
*Assistant Examiner* — Tram H Nguyen
(74) *Attorney, Agent, or Firm* — Knobbe Martens Olson & Bear LLP

(57) ABSTRACT

An organic light emitting diode device is disclosed. The organic light emitting diode device includes: a first electrode, a light emitting section disposed over the first electrode and including at least two light emitters displaying the same or different colors, a second electrode disposed over the light emitting section, and a filler layer for encapsulation disposed over the second electrode and including a light emitter displaying at least one color.

18 Claims, 5 Drawing Sheets

ORGANIC LIGHT EMITTING DIODE DEVICE

CROSS-REFERENCE TO RELATED APPLICATIONS

This application claims priority to and the benefit of Korean Patent Application No. 10-2010-0011008 filed in the Korean Intellectual Property Office on Feb. 5, 2010, the entire contents of which are incorporated herein by reference.

BACKGROUND

1. Field

This disclosure relates to an organic light emitting diode device.

2. Description of the Related Technology

Recently, organic light emitting diode devices (OLED devices) have attracted attention as display devices and illumination devices.

An organic light emitting diode device generally includes two electrodes and an emission layer disposed therebetween, and emits light when electrons injected from one electrode are combined with holes injected from the other electrode forming excitons which release energy.

Since the organic light emitting diode device is a self light-emitting type with no external light source, it exhibits advantages of response speed, viewing angle, and contrast ratio as well as power consumption.

Organic light emitting diode devices include a plurality of sub-pixels such as red, blue, and green sub-pixels and the like in each pixel, and can express full colors by combining them.

Each of the sub-pixels respectively includes an emission layer and expresses a color. The emission layers can be deposited in each sub-pixel using a fine shadow mask. However, as the display device becomes bigger, there is a limit in depositing an emission layer per each sub-pixel using a fine shadow mask.

Therefore, a technology of emitting white light by sequentially accumulating red, blue, and green emission layers over the entire display device and then expressing red, green, and blue per each sub-pixel by putting a color filter where the emitted light passes has been suggested.

Such an organic light emitting diode device may have deteriorated white light emission, since each emission layer has an unstable color characteristic and efficiency depending on the color characteristic.

SUMMARY OF CERTAIN INVENTIVE ASPECTS

One aspect is an organic light emitting diode device including: a first electrode, a light emitting section disposed over the first electrode and including at least two light emitters displaying the same or different colors, a second electrode disposed over the light emitting section, and a filler layer for encapsulation disposed over the second electrode and including a light emitter displaying at least one color.

Another aspect is an organic light emitting diode device including: a first electrode, a second electrode, a light emitting section disposed between the two electrodes, including first and second light emitters displaying the same or different colors, and an encapsulation filler layer disposed over the second electrode, including a third light emitter displaying at least one color.

DETAILED DESCRIPTION OF CERTAIN INVENTIVE EMBODIMENTS

Figure 1:
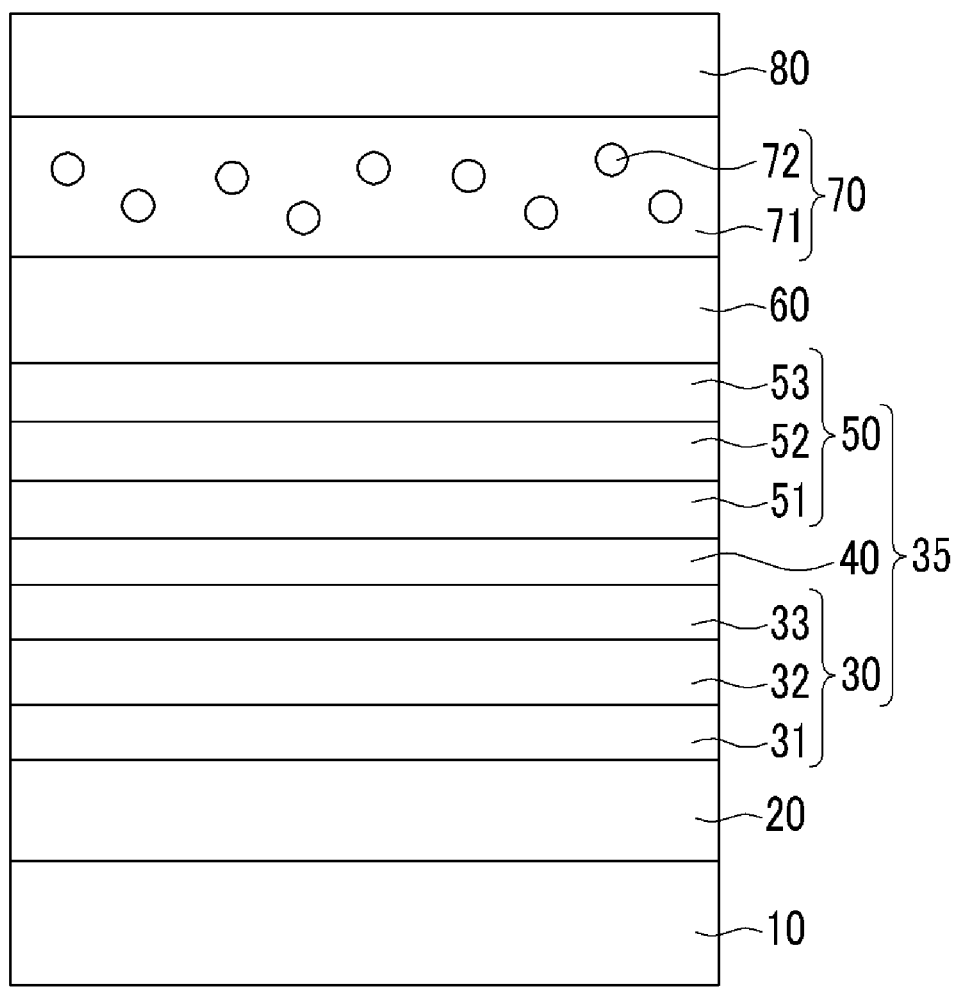
FIG. 1 is a cross-sectional schematic view of an embodiment of an organic light emitting diode device.

This disclosure will be described more fully hereinafter with reference to the accompanying drawings, in which certain exemplary embodiments are shown. This disclosure may, however, be embodied in many different forms and is not to be construed as limited to the exemplary embodiments set forth herein.

In the drawings, the thickness of layers, films, panels, regions, etc., are exaggerated for clarity. Like reference numerals generally designate like elements throughout the specification. It will be understood that when an element such as a layer, film, region, or substrate is referred to as being "on" another element, it can be directly on the other element or intervening elements may also be present.

One embodiment of an organic light emitting diode device is illustrated in FIG. 1.

FIG. 1 schematically shows the cross-sectional view of an embodiment of an organic light emitting diode device.

Referring to FIG. 1, an embodiment of the organic light emitting diode device includes a substrate 10, a lower electrode 20, a light emitting section 35 disposed on the lower electrode 20, an upper electrode 60 disposed on the light emitting section 35, a filling layer for encapsulation 70 on the upper electrode 60, and an encapsulation substrate 80 on the filling layer for encapsulation 70.

In some embodiments, the substrate 10 may be formed of glass or a polymer.

In some embodiments, the lower electrode 20 may be an anode or a cathode, which may be made of a transparent or an opaque conductive material. In some embodiments, the transparent conductive material may be, for example, ITO, IZO, or a combination thereof, while in other embodiments, the opaque conductive material may be, for example, aluminum (Al), silver (Ag), or a combination thereof.

In some embodiments, the light emitting section 35 may include a first light emitter 30, a second light emitter 50, and a charge-generating layer 40 therebetween. In other embodiments, the light emitting section 35 may include three or more light emitters and a charge generating layer between the neighboring light emitters.

In the embodiment of FIG. 1, the first light emitter 30 and the second light emitter 50 may display the same or different colors. The colors from the first and second light emitters 30 and 50 may be combined with colors displayed from other light emitters to display white.

The first light emitter 30 includes an emission layer 32 and auxiliary layers 31 and 33 above and below the emission layer 32. In embodiments where the lower electrode 20 is an anode, the auxiliary layer 31 may include at least one of a hole injection layer (HIL) and a hole transport layer, and the auxiliary layer 33 may include at least one of an electron injection layer (EIL) and an electron transport layer. In some embodiments, at least one of the auxiliary layers 31 and 33 may be omitted.

The second light emitter 50 may also include an emission layer 52 and auxiliary layers 51 and 53 above and below the emission layer 52. In embodiments where the upper electrode 60 is a cathode, the auxiliary layer 51 may include at least one of a hole injection layer (HIL) and a hole transport layer, and the auxiliary layer 53 may include at least one of an electron injection layer (EIL) and an electron transport layer. In some embodiments, at least one of the auxiliary layers 51 and 53 may be omitted.

The charge-generating layer 40 may generate a plurality of electrons and holes. The holes may be transported to one of the neighboring light emitters, while the electrons may be transported to the other of the neighboring light emitters. In some embodiments, the lower electrode 20 is an anode and the upper electrode 60 is a cathode, and electrons generated from the charge-generating layer 40 move to the first light emitter 30 while the holes move to the second light emitter 50.

The charge-generating layer 40 disposed between the first and second light emitters 30 and 50, may improve the current efficiency of a device and its life-span.

Still referring to FIG. 1, an upper electrode 60 is disposed over the light emitting section 35. The upper electrode 60 may be a transparent electrode and thus may deliver light emitted from the light emitting section 35 to the top through the upper electrode 60. In some embodiments, the upper electrode 60 may be made of a conductive oxide such as ITO or IZO, thin aluminum (Al) or silver (Ag), or the like.

The filling layer for encapsulation 70 is disposed over the upper electrode 60. The filling layer for encapsulation 70 includes a filler 71 and a light emitter 72.

The filler 71 may include an inorganic filler, an organic filler, or a combination thereof.

The light emitter 72 may include a photoluminescent material, which is excited and emits light with a particular wavelength, and may include, for example, phosphor, quantum dots such as semiconductor nanocrystal, or a combination thereof. The phosphor may be, for example, a blue phosphor, a green phosphor, or a red phosphor, or a combination of more than two. The semiconductor nanocrystal may be selected from, for example, a Group II-VI semiconductor compound, a Group II-V semiconductor compound, a Group III-VI semiconductor compound, a Group III-V semiconductor compound, a Group IV-VI semiconductor compound, a Group compound, a Group II-IV-VI compound, a Group II-IV-V compound, an alloy thereof, and a combination thereof.

A color displayed from the light emitter 72 may be combined with a color displayed from the first and second light emitters 30 and 50, to display white. At least one of the first and second light emitters 30 and 50 may display a color with a shorter wavelength than a color displayed from the light emitter 72.

The encapsulation substrate 80 is disposed over the filling layer for encapsulation 70. The encapsulation substrate 80 may be made of glass, metal, or a polymer film and may encapsulate the light emitting section 35, cutting off moisture and oxygen from the outside.

FIGS. 2 to 5 show cross-sectional views of other embodiments of organic light emitting diode devices.

In FIGS. 2 to 5, the same reference numerals as in FIG. 1 generally indicate the same constituent element. A light emitting section 35 and a filling layer for encapsulation 70 will be mainly illustrated, but some description may be omitted if overlapped with descriptions included in reference to FIG. 1.

Figure 2:
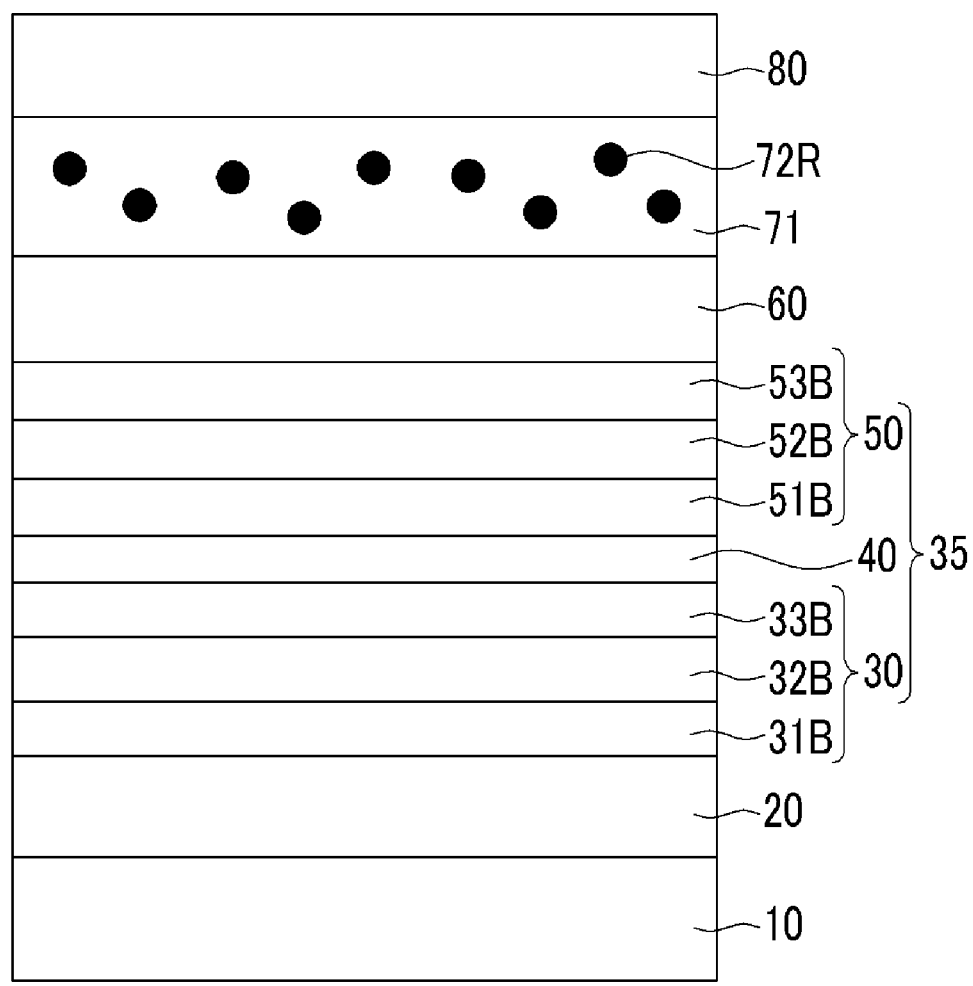
FIG. 2 is a cross-sectional schematic view of another embodiment of an organic light emitting diode device.

Referring to the embodiment in FIG. 2, each of the first and second light emitters 30 and 50 is a blue light emitter, and the filling layer for encapsulation 70 includes a red light emitter 72R. In other embodiments, the light emitter may include any light emitter with a wavelength longer than the wavelength of the blue light emitter.

In particular, the first light emitter 30 includes a blue emission layer 32B, at least one auxiliary layer 31B selected from a hole transport layer (HTL) and a hole injection layer (HIL), and at least another auxiliary layer 33B selected from an electron transport layer (ETL) and an electron injection layer (EIL).

The second light emitter 50 includes a blue emission layer 52B, at least one auxiliary layer 51B selected from a hole transport layer (HTL) and a hole injection layer (HIL), and at least another auxiliary layer 53B selected from an electron transport layer (ETL) and an electron injection layer (EIL).

The red light emitter 72R may be excited by light emitted from the blue emission layers 32B and 52B to display a color with a particular wavelength range. The colors emitted from the red light emitter 72R and the blue emission layers 32B and 52B are combined together to display white.

Figure 3:
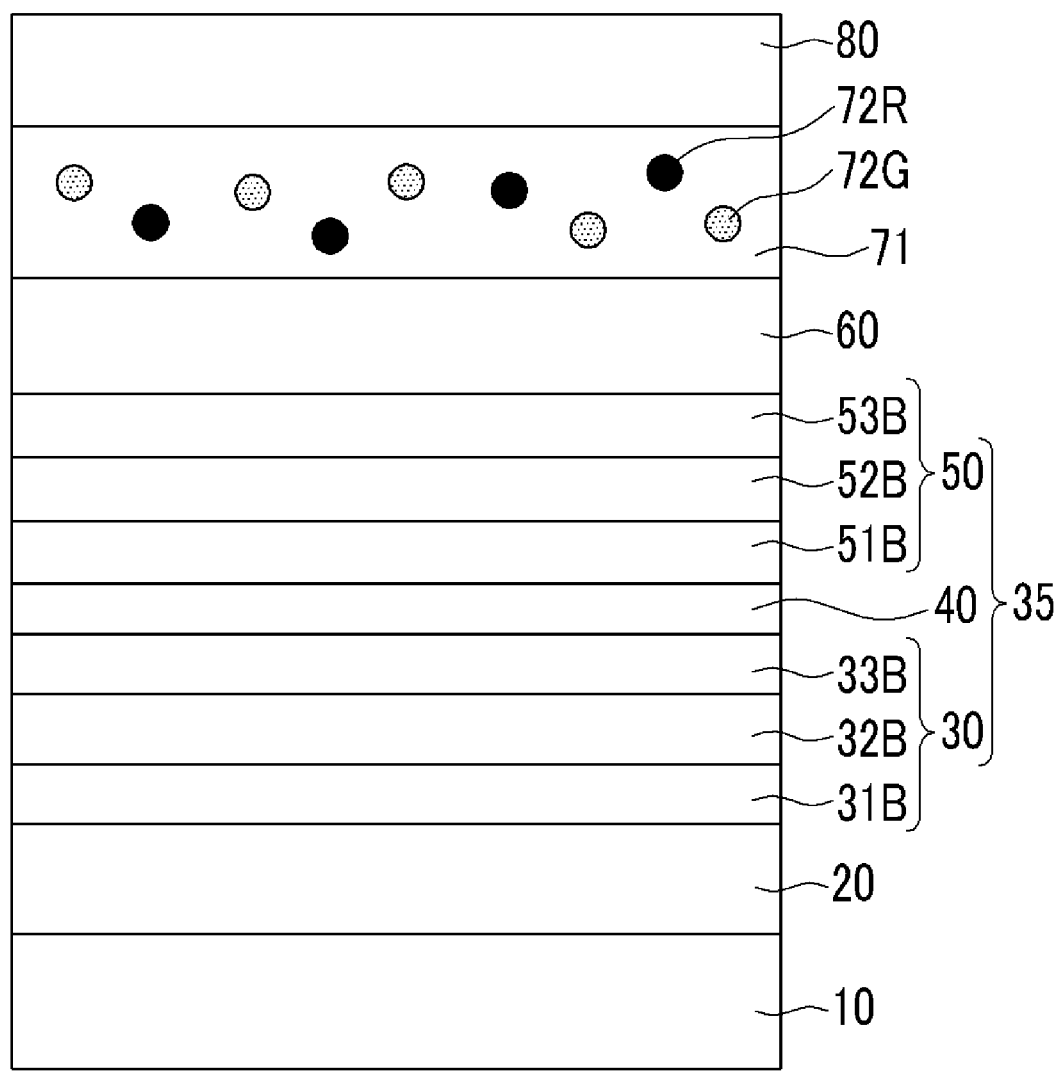
FIG. 3 is a cross-sectional schematic view of another embodiment of an organic light emitting diode device.

Referring to FIG. 3, another embodiment of an organic light emitting diode device includes first and second light emitters 30 and 50, which are respectively blue light emitters, and the filler layer for encapsulation 70 includes a red light emitter 72R and a green light emitter 72G. In other embodiments, the filler layer for encapsulation 70 may include any light emitter including the red and green light emitters with more than two light emitters displaying a color with a longer wavelength than blue being used.

The red and green light emitters 72R and 72G may be excited by light emitted from the blue emission layers 32B and 52B to display a color with a particular wavelength range. The colors from the red and green light emitters 72R and 72G and from the blue emission layers 32B and 52B are combined together to display white.

Figure 4:
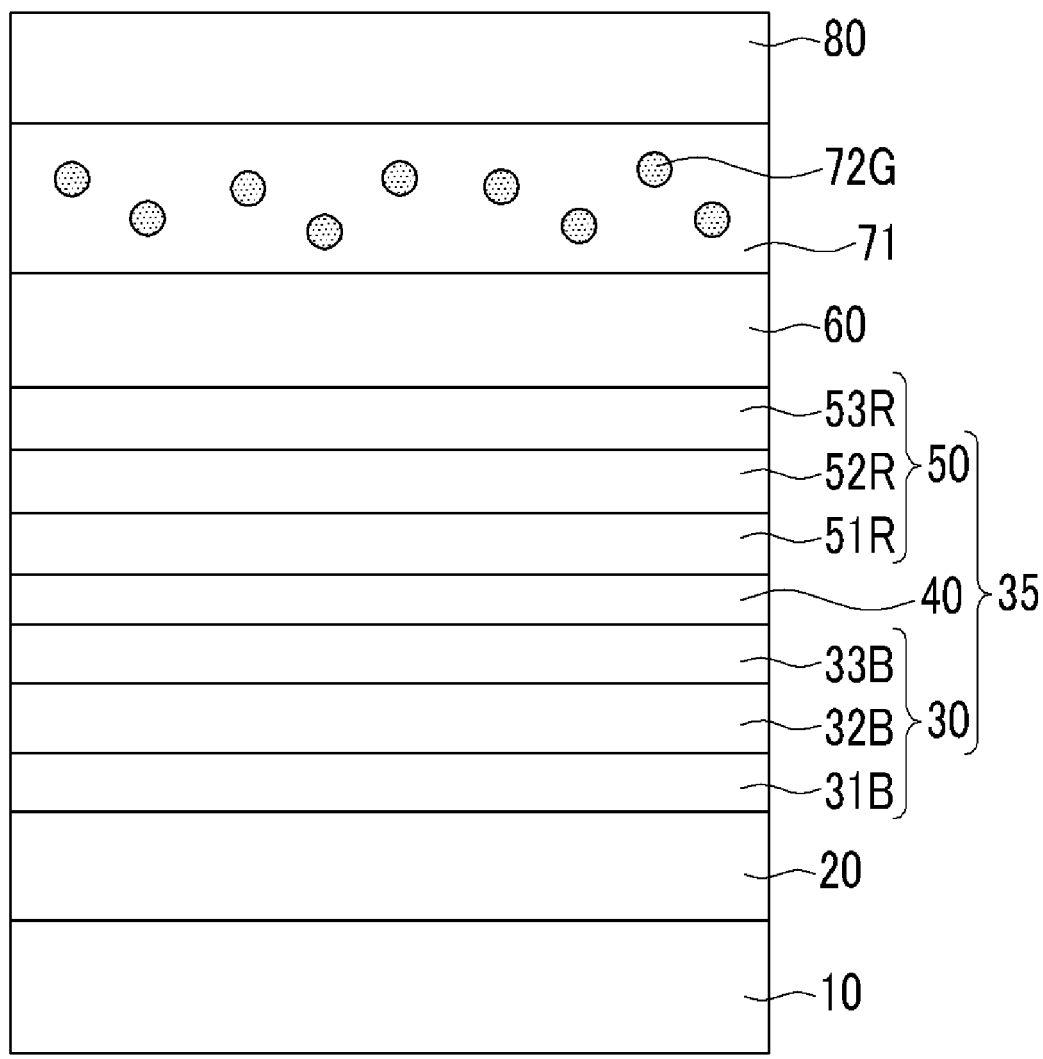
FIG. 4 is a cross-sectional schematic view of another embodiment of an organic light emitting diode device.

FIG. 4 shows another embodiment of an organic light emitting diode device including a blue light emitter as the first light emitter 30, a red light emitting emitter as the second light emitter 50, and a filler layer for encapsulation 70 including a green light emitter 72G.

The first light emitter 30 includes a blue emission layer 32B, at least one auxiliary layer 31B selected from a hole transport layer (HTL) and a hole injection layer (HIL), and at least one auxiliary layer 33B selected from an electron transport layer (ETL) and an electron injection layer (EIL).

The second light emitter 50 includes a red emission layer 52R, at least one auxiliary layer 51R selected from a hole transport layer (HTL) and a hole injection layer (HIL), and at least one auxiliary layer 53R selected from an electron transport layer (ETL) and an electron injection layer (EIL).

The green light emitter 72G may be excited by light emitted from the blue emission layer 32B to display a particular color, and furthermore, the light emitted is combined with a color displayed from the blue emission layer 32B and the red emission layer 52R, to display white.

Figure 5:
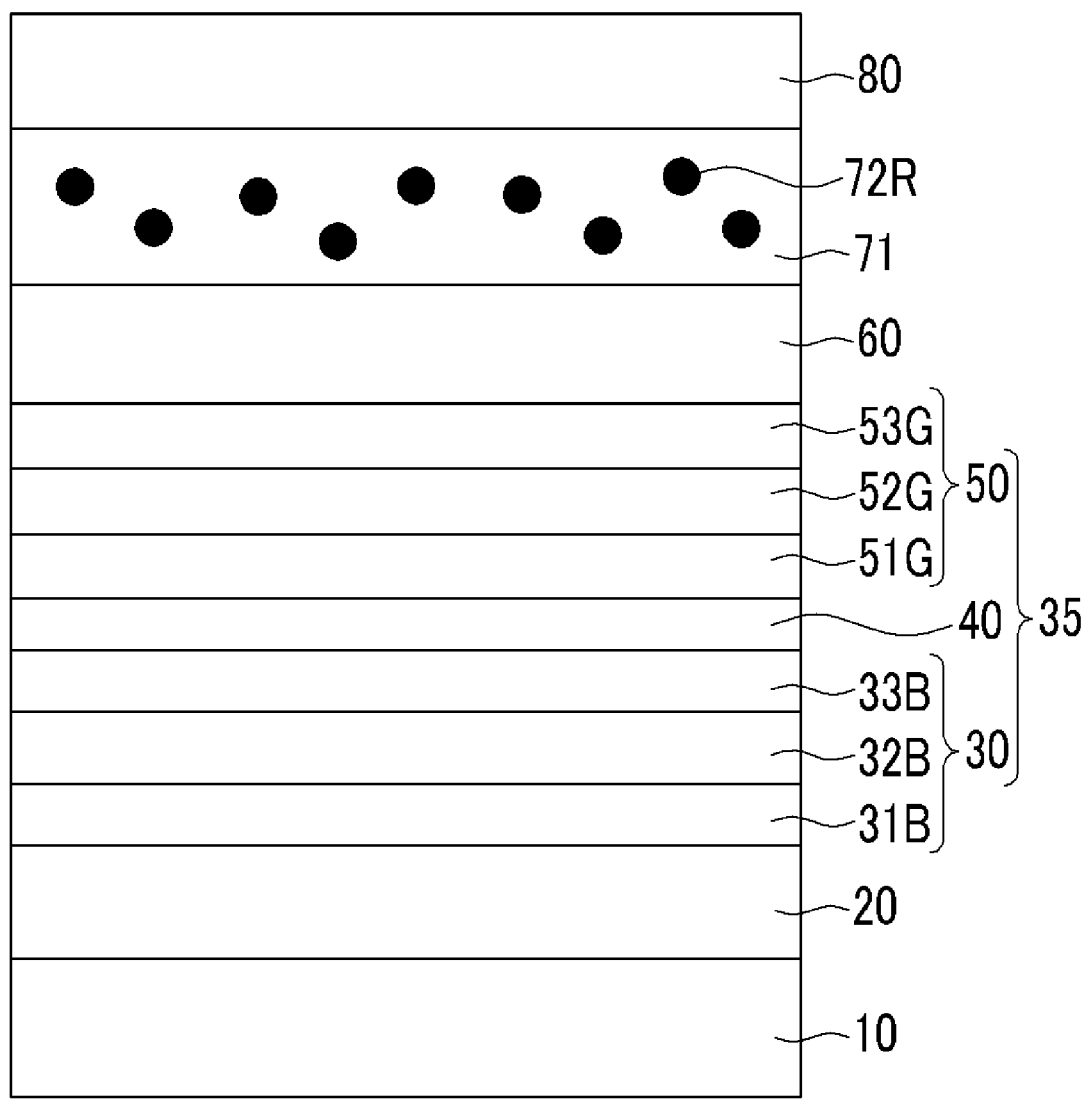
FIG. 5 is a cross-sectional schematic view of another embodiment of an organic light emitting diode device.

FIG. 5 shows another embodiment of an organic light emitting diode device which includes a blue light emitter as the first light emitter 30, a green light emitter as the second light emitter 50, and a red light emitter 72R in the filler layer for encapsulation 70.

The first light emitter 30 may include a blue emission layer 32B, at least one auxiliary layer 31B selected from a hole transport layer (HTL) and a hole injection layer (HIL), and at least one auxiliary layer 33B selected from an electron transport layer (ETL) and an electron injection layer (EIL).

The second light emitter 50 may include a green emission layer 52G, at least one auxiliary layer 51G selected from a hole transport layer (HTL) and a hole injection layer (HIL), and at least one auxiliary layer 53G selected from an electron transport layer (ETL) and an electron injection layer (EIL).

The red light emitter 72R may be excited by light emitted from the blue and green emission layers 32B and 52G to display a color in a particular wavelength region, which may be combined with a color displayed from the blue and green emission layers 32B and 52G, to display white.

Certain embodiments have been disclosed based on red, green, and blue for better understanding and easy description, but other embodiments may include various other colors, where white is displayed by various combinations of the color displayed from an emission layer of the light emitter with a color displayed from a light emitter in the filler layer.

Embodiments may realize stable white by using more than two light emitters to combine a color displayed from the light emitters with a color displayed from a light emitter in the filler layer instead of white displayed by sequentially laminating emission layers.

While this disclosure has been described in connection with certain exemplary embodiments, it is to be understood that the invention is not limited to the disclosed embodiments, but, on the contrary, is intended to cover various modifications and equivalent arrangements included within the spirit and scope of the invention.

What is claimed is:

1. An organic light emitting diode device comprising:
   a first electrode;
   a light emitting section disposed over the first electrode and comprising at least two light emitters displaying one or two colors, wherein the color emitted by a combination of the two light emitters is not white;
   a second electrode disposed over the light emitting section; and
   a filler layer for encapsulation disposed over the second electrode and comprising a light emitter displaying at least one color, wherein the color emitted by the combination of the two light emitters is combined with the color emitted from the light emitter of the filler layer to display white.

2. The organic light emitting diode device of claim 1, wherein the at least two light emitters of the light emitting section each display a color with a shorter wavelength than a color displayed from the light emitter of the filler layer.

3. The organic light emitting diode device of claim 2, wherein at least one of the at least two light emitters of the light emitting section displays blue, and
   the light emitter of the filler layer displays at least one of green and red.

4. The organic light emitting diode device of claim 2, wherein the at least two light emitters of the light emitting section comprise first and second light emitters displaying blue, and the light emitter of the filler layer comprises green and red light emitters.

5. The organic light emitting diode device of claim 1, wherein at least one of the light emitters of the light emitting section displays a color with a shorter wavelength than a color displayed from the light emitter of the filler layer.

6. The organic light emitting diode device of claim 5, wherein the light emitters of the emitting section respectively display blue and red, and the light emitter of the filler layer displays green.

7. The organic light emitting diode device of claim 5, wherein light emitters of the emitting section respectively display blue and green, and the light emitter of the filler layer displays red.

8. The organic light emitting diode device of claim 1, wherein the light emitting section comprises a charge-generating layer disposed between the light emitters.

9. The organic light emitting diode device of claim 1, wherein the second electrode is a transparent electrode.

10. An organic light emitting diode device comprising:
    a first electrode;
    a second electrode;
    a light emitting section disposed between the two electrodes, comprising first and second light emitters displaying the one or two colors, wherein the color emitted by a combination of the first and second light emitters is not white; and
    an encapsulation filler layer disposed over the second electrode, comprising a third light emitter displaying at least one color, wherein the color emitted by the combination of the first and second light emitters is combined with the color emitted from the third light emitter to display white.

11. The organic light emitting diode device of claim 10, wherein the first and second light emitters each display a color with a shorter wavelength than a color displayed by the third light emitter.

12. The organic light emitting diode device of claim 11, wherein at least one of the first and second light emitters displays blue, and the third light emitter displays at least one of green and red.

13. The organic light emitting diode device of claim 11, wherein the first and second light emitters display blue, and the third light emitter comprises green and red light emitters.

14. The organic light emitting diode device of claim 10, wherein at least one of the first and second light emitters displays a color with a shorter wavelength than a color displayed by the third light emitter.

15. The organic light emitting diode device of claim 14, wherein the first and second light emitters respectively display blue and red, and the third light emitter displays green.

16. The organic light emitting diode device of claim 14, wherein the first and second light emitters respectively display blue and green, and the third light emitter displays red.

17. The organic light emitting diode device of claim 10, wherein the light emitting section comprises a charge-generating layer disposed between the first and second light emitters.

18. The organic light emitting diode device of claim 10, wherein the first and second light emitters each comprise an emission layer and at least one auxiliary layer.

\* \* \* \* \*